(12) United States Patent  
Noda et al.

(10) Patent No.: US 7,189,079 B2  
(45) Date of Patent: Mar. 13, 2007

(54) ELECTRO-FORMED RING INTERCONNECTION SYSTEM

(75) Inventors: Atsuhito Noda, Fujisawa (JP); Yasuhiro Ichijo, Yokoshama (JP); Shigeyuki Hoshikawa, Yokohama (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/140,195

(22) Filed: May 27, 2005

(65) Prior Publication Data

US 2005/0266703 A1    Dec. 1, 2005

Related U.S. Application Data

(60) Provisional application No. 60/575,347, filed on May 28, 2004, provisional application No. 60/575,348, filed on May 28, 2004.

(51) Int. Cl.
*H01R 12/00* (2006.01)
*H05K 1/00* (2006.01)

(52) U.S. Cl. .................................................... 439/66
(58) Field of Classification Search ................. 439/66
See application file for complete search history.

(56) References Cited

U.S. PATENT DOCUMENTS

| | | | |
|---|---|---|---|
| 4,109,378 A | | 8/1978 | Davies |
| 4,421,370 A | * | 12/1983 | Treakle et al. ............... 439/91 |
| 5,035,628 A | * | 7/1991 | Casciotti et al. ............. 439/66 |
| 5,071,359 A | | 12/1991 | Arnio et al. |
| 5,199,889 A | | 4/1993 | McDevitt, Jr. |
| 5,214,563 A | * | 5/1993 | Estes ........................ 361/776 |
| 5,679,928 A | | 10/1997 | Okano et al. |
| 5,879,172 A | | 3/1999 | McKenna-Olson et al. |
| 5,971,253 A | | 10/1999 | Gilleo et al. |
| 5,984,692 A | * | 11/1999 | Kumagai et al. ............. 439/66 |
| 6,019,610 A | | 2/2000 | Glatts, III |
| 6,027,346 A | | 2/2000 | Sinsheimer et al. |
| 6,077,091 A | | 6/2000 | McKenna-Olson et al. |

(Continued)

FOREIGN PATENT DOCUMENTS

EP    1049205 A2    11/2000

(Continued)

OTHER PUBLICATIONS

International Search report of copending International Patent Application Ser. No. PCT/US2005/018948, Sep. 30, 2005.

*Primary Examiner*—James R. Harvey
(74) *Attorney, Agent, or Firm*—Thomas D. Paulius

(57) ABSTRACT

Multiple small conductive and flexible hollow rings, each of which is made from a pliable material, provide a flexible connection medium for use between a substrate and a microelectronic device package. Each ring is soldered to both the substrate and the device and held in place during manufacture by way of a flexible non-conductive film in which H-shaped cutouts are formed and into which a conductive ring is inserted. The interior sections of the H-shaped cutouts extend into the conductive rings and hold the rings in place during manufacture. A portion of the sidewall of each ring is not soldered thus insuring that at least part of the ring stays flexible. The rings accommodate elevation differences on a substrate and electronic device package. They also provide a vibration resistant and flexible joint.

6 Claims, 3 Drawing Sheets

U.S. PATENT DOCUMENTS

| | | |
|---|---|---|
| 6,204,455 B1 | 3/2001 | Gilleo et al. |
| 6,224,394 B1 * | 5/2001 | Matsumoto .................. 439/66 |
| 6,686,015 B2 | 2/2004 | Raab et al. |
| 6,716,037 B2 | 4/2004 | Kung et al. |
| 6,722,896 B2 | 4/2004 | McGrath et al. |
| 6,840,777 B2 | 1/2005 | Sathe et al. |
| 6,873,168 B2 | 3/2005 | Kazama |
| 6,939,142 B2 * | 9/2005 | Maruyama et al. ........... 439/66 |
| 2001/0016433 A1 | 8/2001 | Pieper |
| 2004/0002234 A1 | 1/2004 | Masao et al. |
| 2005/0266702 A1 | 12/2005 | Noda et al. |
| 2005/0277309 A1 | 12/2005 | Noda et al. |

FOREIGN PATENT DOCUMENTS

| | | | |
|---|---|---|---|
| EP | 1315244 A1 | | 5/2003 |
| EP | 1381116 A1 | | 1/2004 |
| JP | 06333624 | * | 12/1994 |
| JP | 3236975 | * | 12/2001 |

* cited by examiner

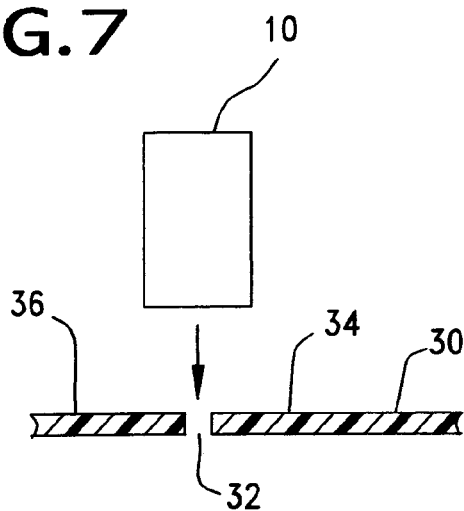
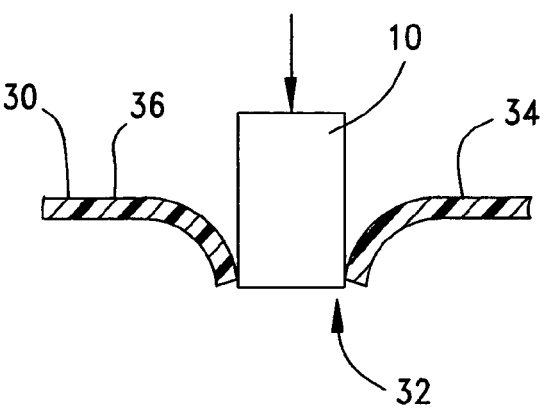
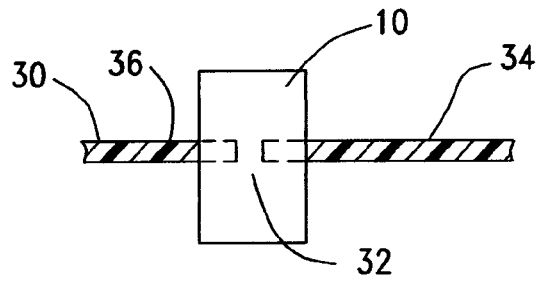
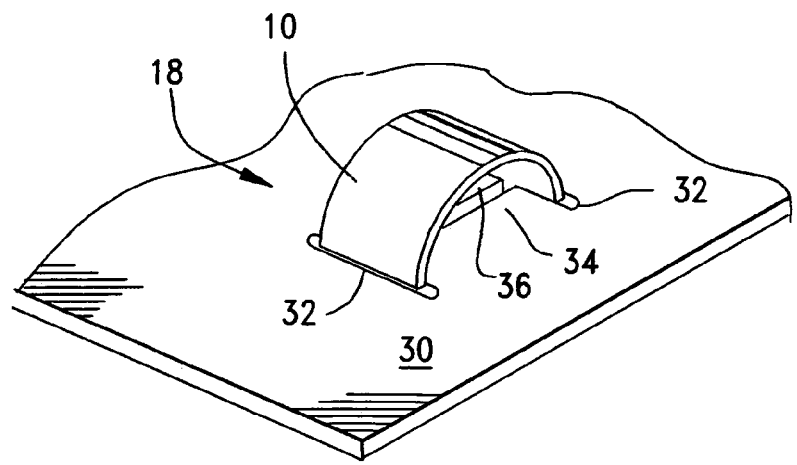
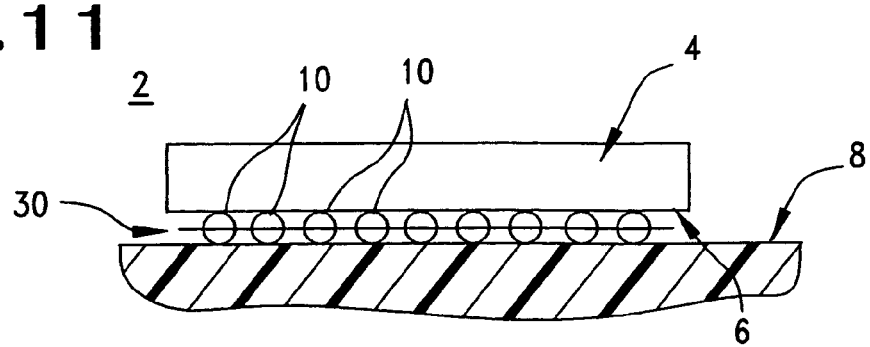

ELECTRO-FORMED RING INTERCONNECTION SYSTEM

REFERENCE TO RELATED APPLICATION

This application claims priority from U.S. provisional patent application Nos. 60/575,347 and 60/575,348, both of which were filed May 28, 2004.

BACKGROUND OF THE INVENTION

The present invention relates generally to high-density electrical interconnections structures and more particularly to such an interconnection structure that may be used in interposer applications and to connect electrical devices to circuit boards.

Microelectronic devices such as state-of-the-art microprocessors require large numbers of reliable connections in increasingly-small areas. As the number of connections between an electronic device and a substrate to which the device is to be mounted increases, the likelihood that just a single connections will not be made or will fail increases.

In "wave soldering," an electronic components is soldered to a substrate by flowing molten solder over a substrate in which electronic components are mounted. A substrate, to which electronic components are to be soldered, is passed over the flowing, molten solder such that exposed metal and fluxed surfaces on the lower surface of the substrate surface wick the molten solder upward from the solder bath. As the substrate with the wicked, molten solder moves away from the molten solder bath, the solder cools and solidifies, establishing an electrical connection between electronic devices and soldered surfaces of the substrate.

As connection density increases in the electronic arts and lead lengths from electronic devices decreases, the increasing number of connections that must be made make it statistically more likely that even a single connection will not be made or will fail. Even minor irregularities in a substrate's planarity can cause connection problems.

One problem with prior art soldering techniques arises when the contact surfaces of a substrate and an electronic device are separated from each other by different distances. For example, if one or two contact leads or one or two contact surfaces of a microprocessor are more widely separated from a planar substrate than the other contact leads or contact surfaces, the molten solder might not wick between the substrate and the more-distant contact surfaces of the electronic device. Prior art soldering techniques suffer from an inability to make a connection when the spacing or distance between contact surfaces of two devices or surfaces to be joined, varies by more than a small amount.

When even a single connection between an electronic device and its supporting substrate is either not made at the time of manufacture, or fails while in use, the cost to identify a failed electrical connection and to repair it can often exceed the cost to manufacture the product in which the electronic device and supporting substrate operates. Improving the manufacturability of electrical connections and improving the reliability of electrical connections after manufacture would be an improvement over the prior art.

The present invention is directed to a connector structure that is suitable for use in high-density applications, is easy to manufacture and which provides a reliable contact force while avoiding the aforementioned shortcomings.

SUMMARY OF THE INVENTION

It is a general object of the present invention to provide a connector device that has a plurality of flexible, conductive rings arranged in an array so as to contact conductive pads on a circuit board and contacts or contact pads of an opposing electronic device.

Microelectronic devices are electrically connected and mounted to a circuit board or other planar surface using small conductive hollow rings between electrical contacts of an electronic device and a circuit board or substrate. Each ring is a band of pliant conductive material that extends around a center point. An axis of rotation extends through each ring. Each ring's axis of rotation is substantially parallel to the other axes or rotation and to the plane of the substrate and the plane of the electronic device.

Each ring acts as a small, round spring-type of contact which will deform when a force is directed toward the interior of the ring from any direction. When the force is removed, the ring will return to its original shape. The resilient behavior of the rings provide a small, flexible interconnection which can accommodate variations in the planarity of opposing surfaces. Each ring's flexibility also accommodates circuit board or substrate flexing as well as impacts and vibration.

The rings are preferably electroformed. Electroforming permits very small rings to be formed and with diameters as small as 500 micrometers. During manufacturing of an electronic device to a substrate, the rings are held in place by a flexible film carrier that is slit, cut or otherwise formed to remove material from the carrier in the shape of the letter "H." A ring is passed "through" the H-shaped material opening in the film carrier and then held in place by film carrier material that extends through the ring's center. Several conductive rings can be carried by a single piece of film, which can then be used to position the rings (and the film carrier) between a substrate and an electronic device. The film carrier supports the rings in the manner of an interposer without require any complex steps of molding the carrier. The film carrier also may flex with or preferably does not offer any interference with the compression and expansion fo the rings.

These and other objects, features and advantages of the present invention will be clearly understood through a consideration of the following detailed description.

BRIEF DESCRIPTION OF THE DRAWINGS

In the course of this detailed description, the reference will be frequently made to the attached drawings in which:

FIG. 7 is an end view of FIG. 6;

FIG. 8 is the same view as FIG. 7, but with the conductive ring partially inserted into the opening of the film carrier;

FIG. 9 is the same view as FIG. 8, but with the conductive ring completely inserted into the opening of the film carrier;

FIG. 10 is a perspective view illustrating the conductive ring in place within the film carrier; and, FIG. 11 is an end view of a connector, or interposer, constructed in accordance with the principles of the present invention illustrating a plurality of rings that are held in place between a substrate and an electronic device by a film carrier.

DETAILED DESCRIPTION OF THE PREFERRED EMBODIMENT

Figure 1:
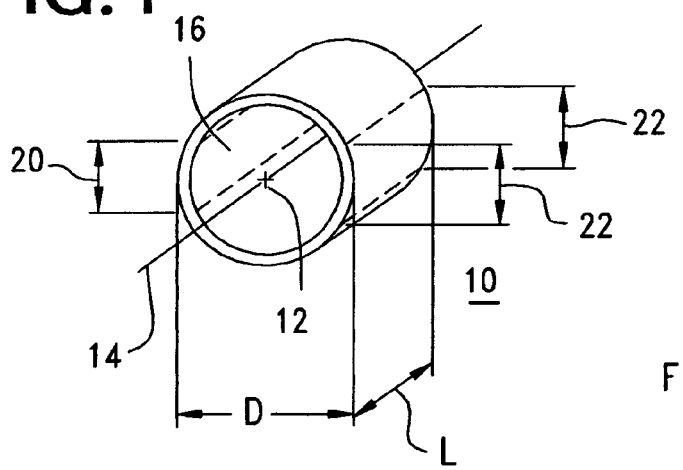
FIG. 1 is a perspective view of a discrete conductive hollow ring constructed in accordance with the principles of the present invention, and which is suitable for connecting an electronic device to a circuit board or other substrate.

FIG. 1 is a perspective view of a discrete conductive hollow ring 10 which is constructed in accordance with the principles of the present invention and which may be used for the mounting of an electronic device to a circuit board or other substrate. In the embodiment shown, the conductive hollow ring 10 has a diameter D substantially the same as the length L of the ring 10, but other configurations may be used.

Figure 1A:
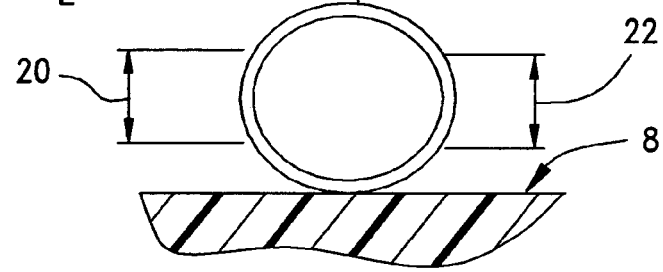
FIG. 1A shows the deformation of the discrete conductive hollow ring of FIG. 1 in response to an externally-applied force.

The ring is preferably made up of a band of pliant conductive material, such as a copper or gold alloy or a spring steel coated or plated with a good conductor such as copper or gold. Alternate embodiments can include resilient plastics that are either plated or otherwise conductively coated. Regardless of its material, as is true of all rings, the material from which it is made is centered about a point in space 12 through which extends an axis of rotation 14 for the ring 10. A force, F, exerted on the ring 10 from the exterior, and directed radially inward of the ring, will cause the ring 10 to deflect as shown in FIG. 1A. As is well-known, as the force F increases past the material's elastic limit, the ring will collapse but as long as the applied force F remains below the elastic limit of the ring material, the ring 10 will act as a spring, and return to its original shape when the applied force is removed. The spring-like action of the ring 10, when used as in array of rings will provide a connection that can accommodate planarity differences between a substrate 8 and an electronic device 6. It can also provide a connection that can be flexed and which will be more tolerant of impact and vibration. The improved physical robustness is provided by the flexible material from which the ring 10 is made, a portion of which between the substrate 8 and device 4 is not soldered.

The ring 10 illustrated is provided with two strips, or bands, of nickel-plating 20, 22 that run along the side of the ring 10 from one open end to the other. The nickel plating bands 20 and 22 act as and are referred to herein as solder barriers 20 and 22. As shown, they are substantially opposite to each other on the exterior surface of the ring 10. They prevent solder from wicking all the way up and around the circumference of the ring, thereby insuring that at least part of flexible ring side wall will not be soldered to the substrate 8 or an opposing surface, but rather will still remain pliant.

Figure 3:
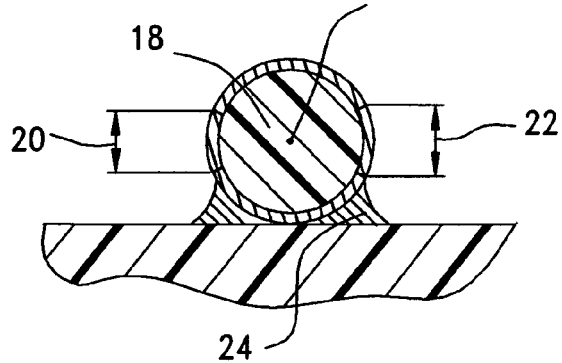
FIG. 3 is a side elevation of a conductive mounting ring filled with a resilient, non-conductive material and the ring being soldered to a substrate.

As shown in FIG. 3, when the ring 10 is attached to a substrate 8, molten solder will only wick upwardly until it reaches the solder barriers 20 and 22. Solder that wicks upward along the exterior of the ring 10 will form fillets 24 between the ring's 10 lower curvature (FIG. 10) and the top of the substrate 8 as part of the normal soldering process. The solder barriers 20 and 22 insure that flexible material from which the ring 10 is made will not be completely coated with solder during a soldering process, insuring that the ring 10 will retain flexibility.

In a preferred embodiment as shown in FIG. 1, the ring 10 side wall cross-section is substantially planar or rectangular. In an alternate embodiment, the ring side wall cross-section can be circular, oval or other shape although non-rectangular side wall shapes might tend to be more rigid. Inasmuch as a circle and an oval are both special case ellipses, the more general side wall shape is referred to herein as elliptical.

Figure 2:
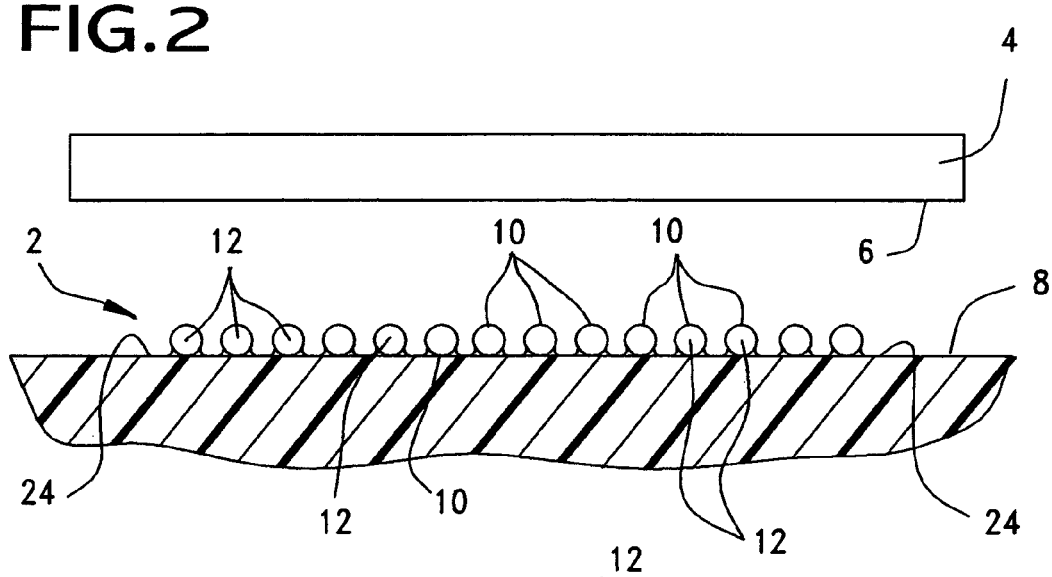
FIG. 2 is a side elevation of a microelectronic device and a plurality of conductive hollow mounting rings mounted to a substrate.

FIG. 2 is a side elevation of a microelectronic device 4 positioned just above a plurality of conductive hollow mounting rings 10, the assembly of which comprise a connector 2 for mounting the electronic device 4 to a circuit board or other substantially planar substrate 8. Each of the rings 10 in FIG. 2 is substantially the same as the ring 10 shown in FIG. 1 albeit in FIG. 2, the solder barriers 20 and 22 are not visible.

The mounting rings 10 in FIG. 2 are aligned to that each of their axes 14 are parallel to each other and extending into the plane of the figure. In an alternate embodiment, the rings 10 can have their axes co-linear.

Inasmuch as the axes 14 extend into the plane of FIG. 2, the axes 14 of the rings 10 also tend to extend parallel to the plane of the substrate 8 which also extends into the plane of FIG. 2, as well as the plane of the underside 6 of the device 4. The side walls of each ring therefore "face" the substrate 8 and the underside 6 of the device 4. The planes in which the ring 10 open ends lie are substantially orthogonal to the substrate surface 8 and the underside 6 of the electronic device 4.

The several discrete conductive hollow rings 10 each provide a redundant signal path along its body between conductive traces on the surface 8 of the substrate and connection points or nodes on the under side 6 of the electronic device 4. Signals can traverse both sides of the ring to get from circuits on the device 4 to circuits on the substrate 8 below. This dual signal path also assist in reducing the inductance of the system in which such contacts are used. As shown in FIG. 2, the several conductive rings 10 are initially attached to the substrate 8 and provide a connector for the device 4.

FIG. 3 shows an alternate embodiment of a conductive ring 10 wherein the interior 18 of the ring 10 is filled with a resilient, non-conductive material 18, such as silicone. The aforementioned solder fillets 24 mechanically and electrically attached the ring 10 to the substrate 8. Filling the interior 18 space with a resilient material increases the strength of the ring 10 but also prevents solder from flowing into the interior space 18 by either wicking or capillary action.

Figure 4:
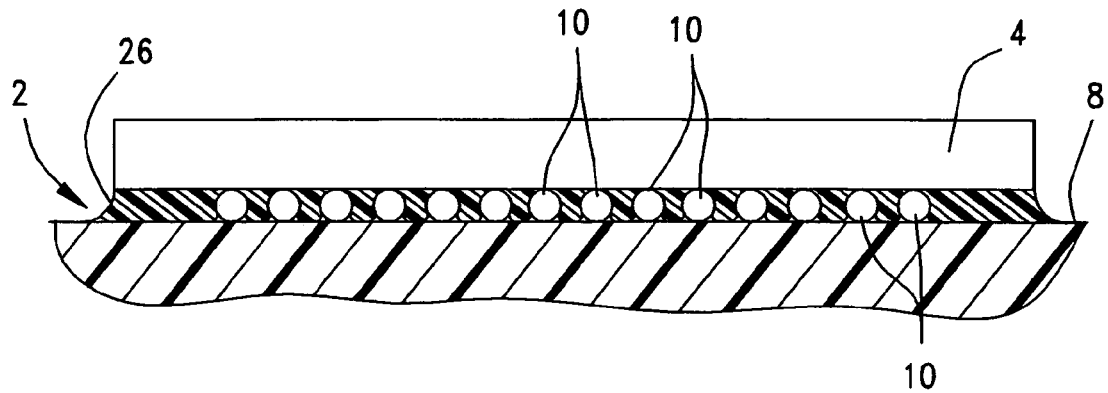
FIG. 4 is a side elevation of a substrate and a plurality of conductive hollow mounting rings mounted to an electronic device; and, FIG. 5 shows a conductive ring and the space between an electronic device and a substrate filled with non-conductive resilient material.

FIG. 4 shows a connector 2 for mounting an electronic device. In FIG. 4, the connector 2 is formed using the aforementioned discrete conductive rings 10, but the connector 2 in FIG. 4 includes a non-conductive under fill material 26 which holds the conductive rings 10 in place with respect to each other. The under fill material 26 can be a non-conductive silicone layer, the thickness of which is less than the outside diameter of the conductive rings 10. When the electronic device 4 is urged downward, each of the rings will deform slightly. Because they are pliable, with each of them tending to oppose a downward compressive force, each conductive ring 10 will tend to make physical contact with the surface of the substrate 8 below it as well as the surface 6 of the electronic device 4 above it. Each ring will therefore provide a better electrical and physical contact than is otherwise possible with a straight pin used in the prior art.

Figure 5:
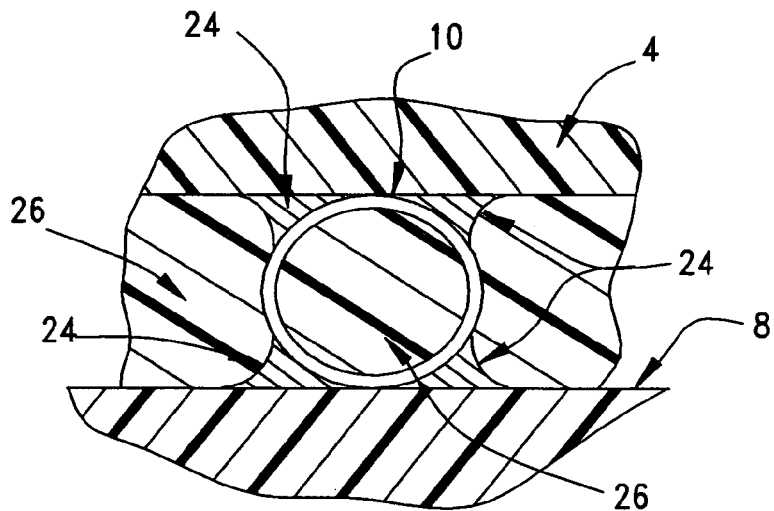

FIG. 5 shows a non-conductive, resilient under fill material 26 disposed between the device 4 and a substrate. It also shows the hollow conductive ring 10 filled with the under fill material, adding stiffness to the ring 10.

The connector 2 shown in FIG. 4 can be initially attached to the substrate 8 or to the electronic device 4. It can be wave soldered to either the substrate 8, the device 4 or both of them simultaneously.

As shown in FIG. 2 and FIG. 3, each of the hollow contact rings 10 of the connector 2 shown in FIG. 4 has solder barriers (not shown in FIG. 4) which prevent molten solder from wicking all the way around the ring 10 thereby defeating the flexibility provided by the thin metal from which the rings are made.

The hollow, conductive rings are preferably made from electronically conductive metals that will also accept a solder barrier. Copper, silver and gold are excellent conductors and can be alloyed with other metals that can provide good resilience; they can also be locally plated with solder-barrier metals such as nickel. The rings 10 can also be formed from metal-plated plastics.

The hollow, conductive rings are preferably made from electronically conductive metals that will also accept a solder barrier. Copper, silver and gold are excellent conductors and can be alloyed with other metals that can provide good resilience; they can also be locally plated with solder-barrier metals such as nickel. The rings 10 can also be formed from metal-plated plastics. In an alternate embodiment of the connector 2 that is shown in FIG. 4, the hollow conductive rings 10 are held in place with respect to each other by a resilient and flexible film (referred to hereafter simply as "flexible film") that is provided with H-shaped cut-outs or slits through which a conductive ring 10 can be passed. As the conductive ring 10 passes into an H-shaped cut, the resilient and flexible film material "inside" the "H" extends into the ring, holding it in place.

Figure 6:
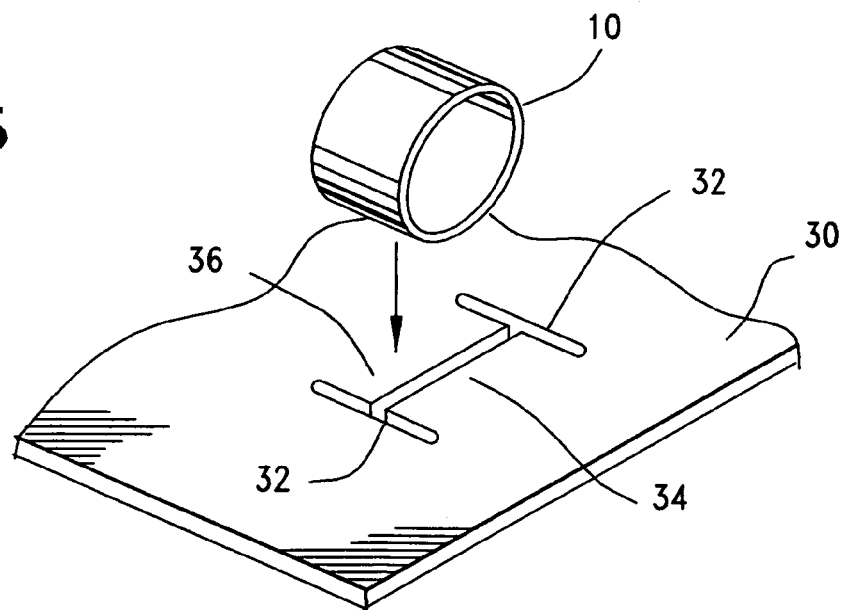
FIG. 6 is a perspective exploded view illustrating how a single conductive hollow ring is aligned with an opening in a flexible film carrier prior to insertion of the ring in the opening.

FIG. 6 illustrates a single conductive hollow ring 10 of a multi-ring connector 2 (not shown in FIG. 6 but shown in cross-section in FIG. 11). The ring 10 is shown as being positioned above a planar sheet of non-conductive flexible film 30 such as Kapton or the like. Thin plastics may also be used. The film 30 may be die-cut or laser-etched or otherwise formed so that the film material is selectively removed such that the removed material forms an opening in the shape of an "H." In FIG. 6, this H-shaped cut is identified by reference numeral 32.

As can be seen in FIG. 6, the film material that is removed from the sheet to form the "H" opening leaves small, flap-like extensions of film material that form flaps of the "H" shape and which extend into the hollow interior of the ring, when assembled. The film material that remains after the H-shaped cut or otherwise formed in the film 30 is identified in FIG. 6 by reference numerals 34 and 36. Because these flaps of film material 34 and 36 are free of the film 30 on three sides, they can also be considered to be cantilevered from the body of the film 30 and opposing each other. If the film 30 is appropriately selected to be appropriately resilient, the opposing flaps 34 and 36 will deflect "downward" when the ring 10 is pushed "into" the "H" thereby allowing the ring 10 to be inserted into the film 30. As the ring 10 continues through the film 30, its perimeter will clear the flaps 34 and 36, allowing them to spring back to their original position. The flaps 34 and 36 will thereafter loosely hold the ring 10 in place by the flaps 34 and 36 extending into the interior 18 of the ring 10.

Those of ordinary skill in the art should appreciate that the ability of the film 30 to fix the hollow conductive rings 10 in their designated positions will depend on the relative size of the rings and H-shaped openings 32 with respect to each other. The conductive hollow rings 10 and their H-shaped associated openings 32 are each preferably sized and shaped so that they can be cooperatively engaged to each other when the conductive hollow ring 10 is inserted and positioned in the H-shaped opening 32.

FIG. 7 shows a conductive hollow ring 10 positioned in alignment with an opening and disposed just above the opposing first and second flaps 34 and 36 formed by the H-shaped opening 32. Each H-shaped opening includes a central base portion that interconnects two spaced-apart leg portions, which are preferably arranged parallel with each other. In FIG. 8, the ring 10 is shown partially through the sheet of flexible film 30, deflecting the opposing first and second carrier flaps 34 and 36, downwardly. In FIG. 9, the conductive hollow ring 10 has been pushed into the H-shaped opening 32, below the extent of the carrier flaps 34 and 36 such that the flaps 34 and 36 cleared the circumference of the ring 10 and returned to their original position, i.e., toward each other. In FIG. 9 however, the carrier flaps 34 extended into the interior 18 of the ring 10. The bodies of the conductive rings are aligned with the center base portions of the H-shaped openings.

FIG. 10 shows one of the rings 10 fully inserted into the H-shaped cut 32 formed in a sheet of non-conductive flexible film 30. The carrier flaps 34 and 36 are shown extending into the interior 18 of the ring 10.

As can be seen in FIG. 10, the tightness of the ring 10 in the film 30 will depend in part on the dimensions of the opening 32 and the thickness of the ring 10 material. The ring 10 can be held in place, relative to other rings (not shown) by the carrier flaps 34 and 36.

Finally, FIG. 11 shows a substantially planar substrate 8 to which a microelectronic device 4 having a substantially planar bottom surface 6 is electrically connected using a connector 2 formed from several, discrete hollow conductive rings 10 that are fixed in space using the aforementioned flexible non-conductive film 30. The device 4, substrate 8 and connector 2 are all shown in cross-section. The rings 10 are held in place during assembly of the device 4 to the substrate 8 by using the aforementioned sheet of non-conductive flexible film 30.

Like the substrate depicted in FIG. 4, the substrate 8 depicted in FIG. 11 also has conductive traces that carry signals to and from the device 4. The several discrete conductive hollow rings 10 each provide a flexible electrical connection between the traces on the substrate 8 and contact points on the device 4. By orienting the "H"cuts (not shown in FIG. 11) the same way, each of the rings 10 can be oriented with their axes parallel to each other. Similarly, by rotating the "H" cuts, the orientation of the rings can be modified as desired. Or, the openings 32 may be arranged within the film carrier in a radial pattern.

Those of skill in the art will recognize that the connector assembly shown in FIG. 11 that is comprised of the film 20 its associated plurality of conductive rings 10 can be attached to and be a part of either the substrate 8, the device 4. The connector assembly can also be used to connect the substrate 8 to the device 4 as its own separate connector.

In the preferred embodiment, the flexible film 30 is embodied as a polyimide film. Those of ordinary skill in the materials art will recognize that other flexible or resilient, non-conductive materials can be used as well.

The rings 10 are preferably formed using an electroforming process, which is well known in the electronics art. Ring 10 dimensions as small as 500 micrometers are possible although larger-dimensioned rings, e.g., up to 1000 micrometers and beyond, are easier to handle for many applications. Alternate embodiments include using flexible plastic to form the rings. By coating the exterior surfaces with metal, plastic rings can be used as well.

As set forth above, the preferred embodiment also may utilize a solder barrier on the exterior surfaces of the ring 10, which acts to stop molten solder from wicking all the way around the ring 10. The solder barrier for the connector 2 shown in FIG. 11 is a band of nickel on the ring's exterior, located on the ring 10, substantially mid-way between the bottom surface 6 of the device 4 and the substrate 8. Keeping the mid-sections of the ring 10 free of solder helps to insure the ring's flexibility.

Those of skill in the art will also appreciate that since each of the rings 10 can be slightly compressed from their original shape so that the rings may overcome slight variations in the planarity of the substrate 8 and/or the electronic device 4. By providing a solder barrier that prevents solder from wicking all the way around a ring, the side walls of each ring acts as a small round spring and will deform when a force is directed toward the interior of the ring. When the force is removed, the ring will return to its original shape. The resilient behavior of the rings provide a small, flexible interconnection which can accommodate variations in the planarity of opposing surfaces. Each ring's flexibility also accommodates circuit board or substrate flexing as well as impacts and vibration. Keeping several rings 10 in position and alignment during manufacturing greatly improves the manufacturability of devices using the flexible rings 10 and increases the reliability of electronic devices. The resulting connection between the substrate 8 and an electronic device 4 is more tolerant of substrate and/or device flexing. The connection is also less susceptible to shock or vibration-induced failure.

While the preferred embodiment of the invention have been shown and described, it will be apparent to those skilled in the art that changes and modifications may be made therein without departing from the spirit of the invention, the scope of which is defined by the appended claims.

What is claimed is:

1. A connector for connecting an electronic device to a substrate, the connector comprising:
   a sheet of non-conductive flexible film, the film having a plurality of H-shaped openings formed therein, each of the openings defining opposing first and second ring retention flaps formed in the film;
   a plurality of continuous, conductive hollow rings, each of the rings including a continuous body that extends completely around an axis of rotation to define a hollow interior volume of said ring, each of the rings enclosing a hollow volume, said rings being held upright in said openings by the opening first and second retention flaps which extend at least part way into said ring hollow interior volumes; and,
   each of said rings is provided with first and second solder barriers on exterior surfaces of said rings for inhibiting the wicking of molten solder around circumferences of said rings during soldering of said rings to a substrate, said first and second solder barriers are disposed opposite each other on said exterior surfaces of each of said rings.

2. The connector of claim 1, wherein said film is a polyimide film.

3. The connector of claim 1, wherein each of said rings is electroformed from metal.

4. The connector of claim 1, wherein each of said rings are formed from a non-conductive material, and at least portions of exterior surfaces of said rings are coated with conductive material.

5. The connector of claim 1, wherein the solder barriers include extents of nickel disposed on said exterior surfaces of each of said rings.

6. The connector of claim 1, wherein said rings have diameters that range from between approximately 500 micrometers and approximately 1500 micrometers.

* * * * *